United States Patent
Chen et al.

[11] Patent Number: 5,920,081
[45] Date of Patent: Jul. 6, 1999

[54] STRUCTURE OF A BOND PAD TO PREVENT TESTING PROBE PIN CONTAMINATION

[75] Inventors: Shyn-Ren Chen, Taipei; Chii-Ming Morris Wu, Hsinchu, both of Taiwan

[73] Assignee: Taiwan Semiconductor Manufacturing Co., Ltd., Hsinchu, Taiwan

[21] Appl. No.: 08/842,946

[22] Filed: Apr. 25, 1997

[51] Int. Cl.⁶ .................................................. H01L 23/58
[52] U.S. Cl. ........................... 257/48; 257/640; 257/649; 257/760; 257/763
[58] Field of Search ................................. 257/640, 649, 257/760, 763, 48

[56] References Cited

U.S. PATENT DOCUMENTS

| | | | |
|---|---|---|---|
| 5,070,036 | 12/1991 | Stevens | 257/760 |
| 5,345,108 | 9/1994 | Kikkawa | 257/760 |
| 5,369,299 | 11/1994 | Byrne | 257/760 |
| 5,459,353 | 10/1995 | Kanazawa | 257/760 |
| 5,481,135 | 1/1996 | Chandra et al. | 257/760 |
| 5,614,439 | 3/1997 | Murooka et al. | 257/760 |
| 5,619,072 | 4/1997 | Mehta | 257/760 |
| 5,666,907 | 9/1997 | Chung | 257/763 |
| 5,991,572 | 11/1997 | Chung | 257/763 |

*Primary Examiner*—Olik Chaudhuri
*Assistant Examiner*—Alonzo Chambliss
*Attorney, Agent, or Firm*—Merchant, Gould, Smith, Edell, Welter & Schmidt, P. A.

[57] ABSTRACT

A structure of a bond pad to prevent probe pin contamination is disclosed herein a first conductor layer is formed on the substrate. A passivation layer including a titanium nitride layer, a silicon nitride layer, and a silicon oxide layer is formed on the first conductor layer. A photoresist layer is patterned on the passivation layer to define a contact hole, and then etching the passivation layer using the photoresist layer as a mask to form the contact hole. A second conductor layer serving as a top metal of bond pad harder than the first conductor layer is selectively deposited on the first conductor layer, and filled in the contact hole. The present invention can reduce a probe pin contamination so that extend the probe pin lifetime using this selective deposition technique to form the pond pad structure. Additionally, the structure can prevent the contact resistance between the probe pin head and the bond pad increasing, and reduce the probe pin overkill ratio.

8 Claims, 2 Drawing Sheets

STRUCTURE OF A BOND PAD TO PREVENT TESTING PROBE PIN CONTAMINATION

BACKGROUND OF THE INVENTION

1. Field of the Invention

The present invention relates to a structure of a bond pad, and more particularly to a structure of a bond pad to prevent testing probe pin contamination.

2. Description of the Prior Art

As illustrated in FIG. 1, it shows the conventional bond pad structure. A metal conductor layer 10 is formed on the substrate, and it is consisted of aluminum-copper alloy (AlCu) serving as a bond pad. Next, a titanium Nitride (TiN) layer 12, an oxide layer 14, a nitride layer 16 are subsequently deposited on the metal conductor layer 10. They serve as a passivation layer. A contact hole 18 can be formed via photolithography and etching steps to etch a portion of the titanium Nitride (TiN) layer 12, the oxide layer 14, the nitride layer 16. A testing probe pin directly contacts on the metal conductor layer 10 to measure the conductivity of the metal conductor layer 10. Because the conventional testing method uses aluminum-copper alloy (AlCu) as a top metal of bond pad which is very soft, when the testing probe pin directly contacts on the metal conductor layer to measure the conductivity of the metal conductor layer, the aluminum-copper alloy (AlCu) residue will easily reside on the probe pin head. After probing many times, the probe pin will be contaminated seriously, and the method will result in two major disadvantages as follow:

(1) Time between probe pin maintenance need to be shortened. This will increase probe pin wear out rate (i.e., the probe pin usually needs to be polished to maintain the normal testing function).

(2) It will increase overkill ratio (i.e., the probe pin is usually serious damage reduced by abnormal electrical effect on the contact surface of tested metal). Since there is aluminum-copper alloy (AlCu) residued on probe pin head, the contact resistance between the probe pin head and the bond pad will apparently increase. In some critical testing environment, such as high frequency or low supplied voltage testing, it is very easy to cause overkill. However, high frequency and low power device is the trend for future product.

SUMMARY OF THE INVENTION

It is a primary object of the present invention to provide a structure of a bond pad to prevent testing probe pin contamination. In accordance with the present invention, the structure can reduce probe pin polish times so that extend probe pin lifetime.

It is another object of the present invention to provide a structure of a bond pad to prevent testing probe pin contamination. The present invention structure can reduce metal residue of bond pad residues on testing probe pin head so that contact resistance between the probe pin head and the bond pad will not apparently increase. In one embodiment can prevent testing overkill induced by the probe pin contamination.

Accordingly, the present invention provides a structure of a bond pad to prevent testing probe pin contamination. The method comprises the steps as follow:

A aluminum-copper alloy (AlCu) is formed on a substrate. A passivation layer is formed on aluminum-copper alloy (AlCu), where the passivation layer is consisted of a titanium Nitride (TiN) layer, an oxide layer, a nitride layer.

Next, a photoresist is patterned on the passivation layer, covering portions of the top surface of the passivation layer to define a contact hole. An etching process is performed to etch the passivation layer using the photoresist as an etching mask, and the contact hole is formed. After the photoresist is removed, a tungsten layer is selective deposited on aluminum-copper alloy (AlCu), and filled in the contact hole. The tungsten layer serves as a top metal of bond pad, and probe pin directly contacts with the tungsten layer to measure the conductivity of the metal conductor layer (AlCu). By the way, the present invention can reduce probe pin head contamination.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the structure and the method of the present invention. In the preferred embodiment, the structure will be described first along with a description of modifications. A preferred method for forming the structure will then be described.

Figure 1:
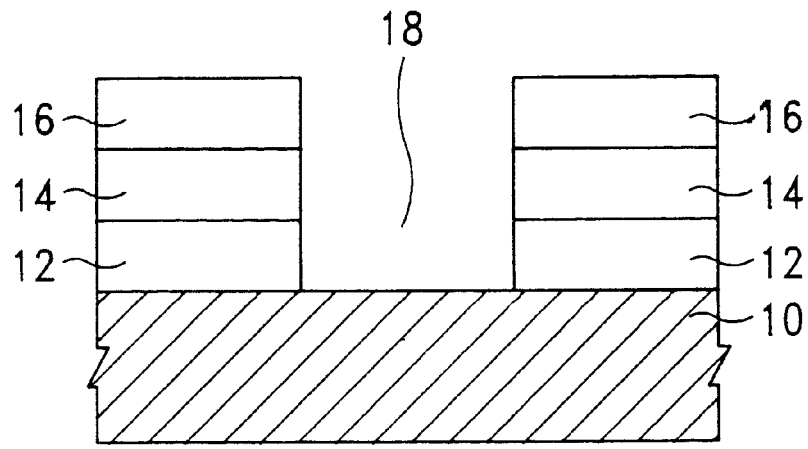
FIG. 1 is cross-sectional view of a semiconductor wafer illustrating the structure of bond pad, according to the conventional method.
Figure 2A:
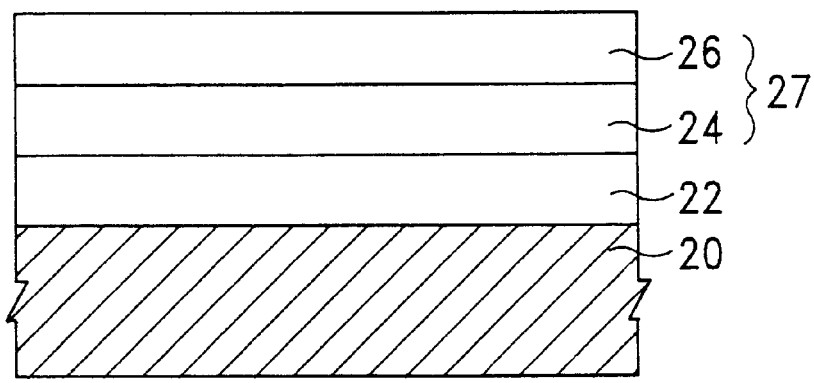
FIG. 2A to FIG. 2C are a cross-sectional view of semiconductor wafer illustrating the steps of forming bond pad, according to one embodiment of the present invention.

Referring to FIG. 2A, a metal conductor layer 20 is deposited over a substrate, and it is consisted of aluminum-copper alloy (AlCu) serving as a bond pad. A titanium nitride (TiN) layer 22 is deposited on the metal conductor layer 20 using a conventional chemical vapor deposition (CVD) process. The thickness of the titanium nitride (TiN) layer 22 can range from about 150 to 350 angstroms. A silicon oxide layer 24 is deposited on the titanium nitride (TiN) layer 22 by a conventional chemical vapor deposition (CVD) process. The silicon oxide layer 24 has the thickness of about 1800 to 2200 angstroms. A silicon nitride layer 26 is deposited on the silicon oxide layer 24 using a conventional chemical vapor deposition (CVD) process to have the thickness about 6300 to 7700 angstroms. The silicon oxide layer 24, and the silicon nitride layer 26 sever as a passivation layer 27.

Figure 2B:
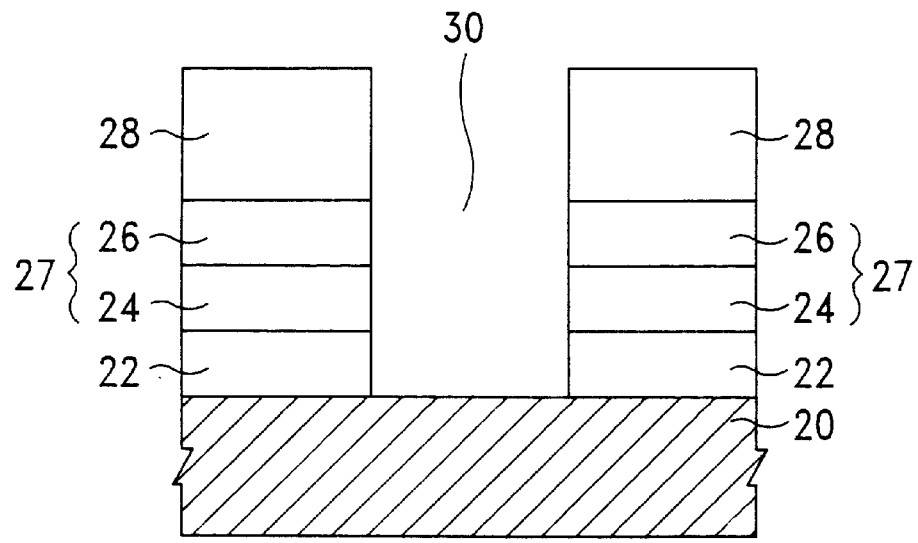

Afterwards, referring to FIG. 2B, a photoresist 28 is patterned on the passivation layer 27 and formed an etching mask over the passivation layer 27 to define a contact hole region. Then an etching process is used to etch the unmasked portions of the titanium nitride (TiN) layer 22, the silicon oxide layer 24, and the silicon nitride layer 26 to the metal conductor layer 20. A contact hole 30 is formed after the etching process.

At this time, the tungsten film has better selective deposition character using the chemical vapor deposition process in a control of low temperature, in other words, tungsten film can't be deposited on the top surface of silicon nitride using a low temperature chemical vapor deposition process. Therefore, it is unnecessary adding an etching process to remove tungsten film on silicon nitride.

Figure 2C:
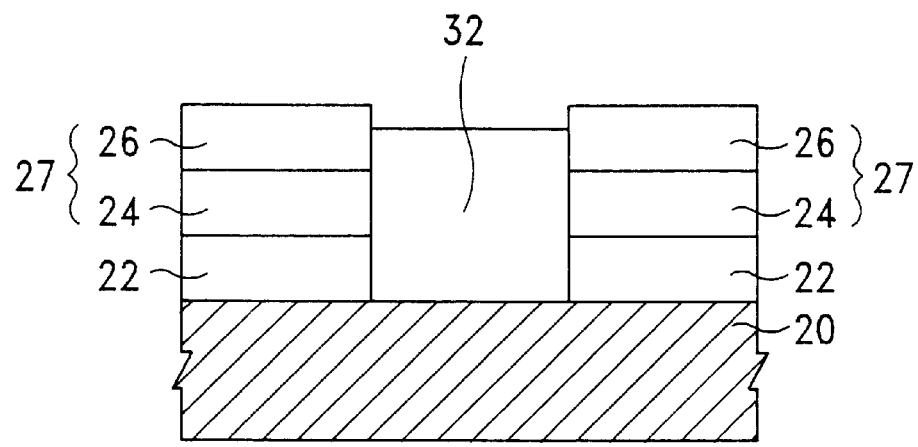

Referring to FIG. 2C, then the photoresist 28 is stripped away. A tungsten layer 32 is selectively deposited on the metal conductor layer 20, and filled in the contact hole 30 using a low temperature chemical vapor deposition process. In this embodiment, this selective deposition process controls temperature in the low temperature range from about 250° C. to 300° C. The thickness of the tungsten layer 32 can range from about 5400 to 6600 angstroms.

While testing the conductivity, a testing probe pin directly contacts on the tungsten layer 32 severing as a top metal of bond pad to measure the conductivity of the metal conductor layer 20.

Accordingly, the conventional method uses aluminum-copper alloy (AlCu) as a top metal of bond pad, and the materiality of aluminum-copper alloy (AlCu) is too soft. A probe pin directly contacts with aluminum-copper alloy to measure the conductivity of the metal conductor layer, and the probe pin head will be very easy to reside aluminum-copper alloy. After using the probe pin many times, the probe pin will be contaminated seriously. In one embodiment of the present invention, a tungsten layer is selectively deposited on aluminum-copper alloy of the contact hole in the appropriate temperature control. Because, tungsten film is harder than aluminum-copper alloy, the residual metal on probe pin head will reduce, when probe pin head directly contacts with tungsten film. Therefore, the probe pin will not cause serious contamination after probing many times by using the present invention. The present invention reduce probe pin wear out rate to extend probe pin lifetime, and prevent testing overkill induced by probe pin contamination (i.e., the contact resistance between the probe pin head and the bond pad will not apparently increase in some critical testing environment such as high frequency or low supplied voltage testing). Additional, in the present invention process, it only adds one step of selective deposition after forming a contack hole. A portion of passivation layer is etched using a phothresist as an etching mask to form the contact hole. The tungsten is selectively deposited on the aluminum-copper alloy by adjusting temperature in a chemical vapor deposition process. Therefore, the entire process is just minor changed and the method can improve some problems induced by probe pin series contamination.

Although specific embodiments including the preferred embodiment have been illustrated and described, it will be obvious to those skilled in the art that various modifications may be made without departing from the spirit and scope of the present invention, which is intended to be limited solely by the appended claims. For example, with the semiconductor process necessity, the tungsten film can be deposited by adjusting different temperature range, or replaced with the other conductive materiality which is more harder than the metal conductor layer (aluminum-copper alloy). The other conductive materiality is selectivly deposited on aluminum-copper alloy and filled in the contact hole. The other conductive materiality is used as a top metal of bond pad to measure the conductivity of metal conductor layer (aluminum-copper alloy) to reduce the probe pin head contamination.

What is claimed is:

1. A structure of bond pad on a substrate, said structure being used to prevent a probe pin contamination, said structure comprising:

a first conductor layer formed on said substrate;

a passivation layer formed on said first conductor layer, said passivation layer comprising:

a titanium nitride layer formed on said first conductor layer;

a silicon oxide layer formed on said titanium nitride layer;

a silicon nitride layer formed on said silicon oxide layer;

a contact hole formed in said passivation layer; and a second conductor layer formed on said first conductor layer and in said contact hole, said second conductor layer being harder than said first conductor layer.

2. The structure of claim 1, wherein said first conductor layer is aluminum-copper alloy.

3. The structure of claim 1, wherein said first conductor layer is about 7200 to 8800 angstroms in thickness.

4. The structure of claim 1, wherein the thickness of said titanium nitride layer is in a range about 150 to 350 angstroms.

5. The structure of claim 1, wherein the thickness of said silicon oxide layer is in a range about 1800 to 2200 angstroms.

6. The structure of claim 1, wherein the thickness of said silicon nitride layer is in a range about 6300 to 7700 angstroms.

7. The structure of claim 1, wherein said second conductor layer is tungsten to serve as a top metal of said bond pad.

8. The structure of claim 1, wherein said conductor layer is about 5400 to 6600 angstroms in thickness.

\* \* \* \* \*